(12) United States Patent
Yang et al.

(10) Patent No.: US 10,868,244 B2
(45) Date of Patent: *Dec. 15, 2020

(54) MULTIPLE HARD MASK PATTERNING TO FABRICATE 20NM AND BELOW MRAM DEVICES

(71) Applicant: Taiwan Semiconductor Manufacturing Company, Ltd., Hsinchu (TW)

(72) Inventors: Yi Yang, Fremont, CA (US); Yu-Jen Wang, San Jose, CA (US); Jesmin Haq, Milpitas, CA (US); Tom Zhong, Saratoga, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/600,943

(22) Filed: Oct. 14, 2019

(65) Prior Publication Data

US 2020/0044147 A1 Feb. 6, 2020

Related U.S. Application Data

(63) Continuation of application No. 15/790,649, filed on Oct. 23, 2017, now Pat. No. 10,446,741.

(51) Int. Cl.
*H01L 43/08* (2006.01)
*H01L 43/12* (2006.01)
*H01L 21/033* (2006.01)
*H01F 41/30* (2006.01)

(52) U.S. Cl.
CPC ........... *H01L 43/12* (2013.01); *H01F 41/302* (2013.01); *H01L 21/0332* (2013.01); *H01L 21/0335* (2013.01); *H01L 21/0337* (2013.01); *H01L 21/0338* (2013.01); *H01L 43/08* (2013.01)

(58) Field of Classification Search
CPC . H01L 43/08; H01L 21/0332; H01L 21/0335; H01L 21/0337; H01L 21/0338; H01L 21/76811; H01L 21/32
See application file for complete search history.

(56) References Cited

U.S. PATENT DOCUMENTS

| 8,420,408 B2 | 4/2013 | Lee et al. |
| 8,747,680 B1 | 6/2014 | Deshpande et al. |
| 8,975,088 B2 | 3/2015 | Satoh et al. |
| 9,543,502 B2 | 1/2017 | Zou et al. |

(Continued)

*Primary Examiner* — Christine A Enad
(74) *Attorney, Agent, or Firm* — Haynes and Boone, LLP

(57) ABSTRACT

A method for etching a magnetic tunneling junction (MTJ) structure is described. A stack of MTJ layers on a bottom electrode on a wafer is provided. A metal hard mask layer is provided on the MTJ stack. A stack of multiple dielectric hard masks is formed on the metal hard mask wherein each successive dielectric hard mask has etch selectivity with respect to its underlying and overlying layers. The dielectric hard mask layers are etched in turn selectively with respect to their underlying and overlying layers wherein each successive pattern size is smaller than the preceding pattern size. The MTJ stack is etched selectively with respect to the bottommost combination dielectric and metal hard mask pattern to form a MTJ device having a MTJ pattern size smaller than a bottommost pattern size.

20 Claims, 3 Drawing Sheets

(56) References Cited

U.S. PATENT DOCUMENTS

| | | | |
|---|---|---|---|
| 9,722,174 B1 | 8/2017 | Nagel et al. | |
| 10,008,662 B2 | 6/2018 | You et al. | |
| 10,446,741 B2* | 10/2019 | Yang | H01L 21/0332 |
| 2009/0130779 A1* | 5/2009 | Li | H01L 43/12 |
| | | | 438/3 |
| 2010/0240151 A1* | 9/2010 | Belen | H01L 43/12 |
| | | | 438/3 |
| 2010/0327248 A1 | 12/2010 | Khoueir et al. | |
| 2015/0236248 A1 | 8/2015 | Deshpande et al. | |
| 2019/0123267 A1 | 4/2019 | Yang et al. | |

* cited by examiner

US 10,868,244 B2

MULTIPLE HARD MASK PATTERNING TO FABRICATE 20NM AND BELOW MRAM DEVICES

PRIORITY DATA

The present application is a continuation application and claims the benefit of U.S. patent application Ser. No. 15/790,649, filed Oct. 23, 2017, herein incorporated by reference in its entirety.

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define those millions of magnetic tunnel junction (MTJ) cells in each MRAM device and make them non-interacting to each other, precise patterning steps including photolithography and reactive ion etching (RIE), ion beam etching (IBE) or their combination are usually involved. During photolithography, patterns are transferred from a photomask to a light-sensitive photoresist and later transferred to MTJ stacks by RIE, IBE or their combination, forming separate and non-interacting MTJ devices. Therefore the MTJ cell size is generally determined by the photoresist pattern size. To fabricate future sub-nano node products with ultra-small device size, various complex and expensive photolithography systems such as immersion deep ultraviolet (DUV) and extreme ultraviolet (EUV) are needed. A simple low cost alternative solution would be preferred.

Several patents teach using more than one hard mask. U.S. Patent Application 2010/0327248 (Khoueir et al) and U.S. Pat. No. 9,543,502 (Zou et al) and U.S. Pat. No. 9,722,174 (Nagel et al). All of these references are different from the present disclosure.

SUMMARY

It is an object of the present disclosure to provide an improved method of forming MTJ structures.

Yet another object of the present disclosure is to provide a method of forming MTJ structures much smaller than photoresist pattern size.

A further object is to provide a method of optimizing plasma etch conditions during the patterning of multiple hard masks, gradually reducing hard mask size, resulting in a much reduced MTJ device size.

A still further object is to provide an optimized multiple hard mask process eventually decreasing the initial photoresist pattern size of ~80 nm to a final MTJ device size of 20 nm and below.

In accordance with the objectives of the present disclosure, a method for etching a magnetic tunneling junction (MTJ) structure is achieved. A stack of MTJ layers on a bottom electrode on a wafer is provided. A metal hard mask layer is provided on the MTJ stack. A stack of multiple dielectric hard masks is formed on the metal hard mask wherein each successive dielectric hard mask has etch selectivity with respect to its underlying and overlying layers. The dielectric hard mask layers are etched in turn selectively with respect to their underlying and overlying layers wherein each successive pattern size is smaller than the preceding pattern size. The MTJ stack is etched selectively with respect to the bottommost combined dielectric and metal hard mask pattern to form a MTJ device having a MTJ pattern size smaller than a bottommost pattern size.

BRIEF DESCRIPTION OF THE DRAWINGS

In the accompanying drawings forming a material part of this description, there is shown.

DETAILED DESCRIPTION

In the present disclosure, we introduce a series of plasma etch approaches that can reduce their corresponding hard mask pattern size. Starting with a photoresist pattern size of ~80 nm, the hard mask is gradually reduced to ~50 nm, ~40 nm and ~30 nm at sequential steps, eventually allowing for a MTJ device size smaller than 20 nm after the final MTJ etch. This process is a simple, low cost approach to fabricate future sub 20 nm MTJ devices without involving high cost, complex exposure systems with ultra-small wavelength.

Typically, patterns are transferred from photoresist to metal hard mask, and then to MTJ. Thus, the minimal MTJ pattern size is defined by the minimal metal hard mask size, which is decided by the minimal photoresist pattern size, i.e., ~70 nm using a 248 nm wavelength photolithography tool. In the process of the present disclosure, we insert multiple hard masks consisting of (from bottom to top) SiON/spin-on carbon (SOC)/Si hard mask (Si HM) above the metal hard mask and underneath the photoresist. By optimizing their plasma etch conditions, we can decrease Si HM pattern size to ~50 nm, SOC to ~40 nm, SiON and metal hard mask to ~30 nm and final MTJ device size to 20 nm or below. The high etch selectivity among each hard mask layer also allows for high pattern integrity and reduces the device non-uniformity.

Figure 1:
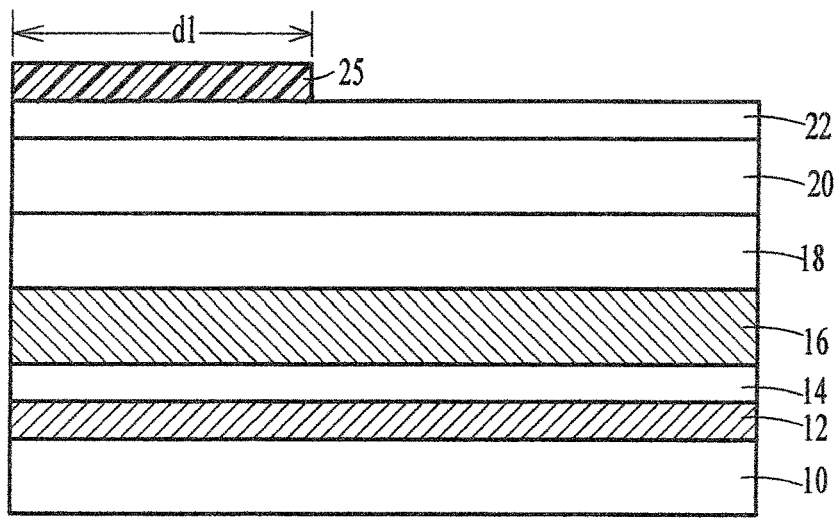
FIGS. 1 through 6 illustrate in cross-sectional representation steps in a preferred embodiment of the present disclosure.

The schematic process flow of a 20 nm or below MTJ cell created by multiple hard mask etching is shown in FIGS. 1-6. FIG. 1 illustrates a bottom electrode layer 12 formed on a semiconductor substrate 10. Next, the MTJ film layers are deposited, typically including a seed layer, a pinned layer, a barrier layer, a free layer, and a cap layer, for example. These layers form the MTJ film stack 14.

On top of MTJ stack 14, a metal hard mask 16 such as Ta, Ti, TaN or TiN is deposited, preferably to a thickness of between about 30 and 100 nm. Then, multiple dielectric hard masks are deposited on the metal hard mask sequentially. First dielectric hard mask 18 may comprise silicon oxynitride (SiON), silicon oxide, or silicon nitride (SiN), having a thickness of between about 10 and 1000 nm. Second dielectric hard mask 20 may comprise spin-on carbon (SOC) or physically or chemically deposited amorphous carbon, having a thickness of between about 100 and 500 nm. Third dielectric hard mask 22 may comprise Silicon (Si), SiON, or SiN, having a thickness of between about 10 and 50 nm. Each dielectric hard mask is etch selective with respect to its overlying and underlying layers.

Figure 2:
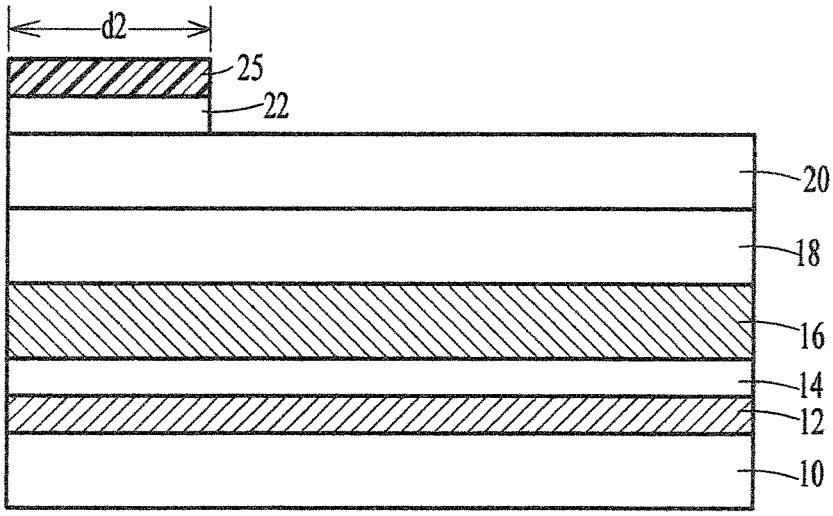

Finally, a photoresist layer is coated on top of the hard mask stack. During photolithography with a typical 248 nm wavelength light source, a photoresist pattern 25 size d1 (~80 nm) is formed as shown in FIG. 1. Now, the Si hard mask 22 is etched in a reactive ion etching (RIE) step by a plasma using a fluorine-based gas such as $CF_4$ or $CHF_3$ mixed with $O_2$. Fluorine gas is the main gas that readily etches the Si hard mask (HM), but it has a lower etch rate on carbon based photoresist and SOC, above and underneath the Si HM, respectively, allowing for a good selectivity and high pattern quality. $O_2$ is added to remove any polymer residues during the reaction and thus greatly reduces the pattern size to d2 (~45-50 nm) as shown in FIG. 2.

Figure 3:
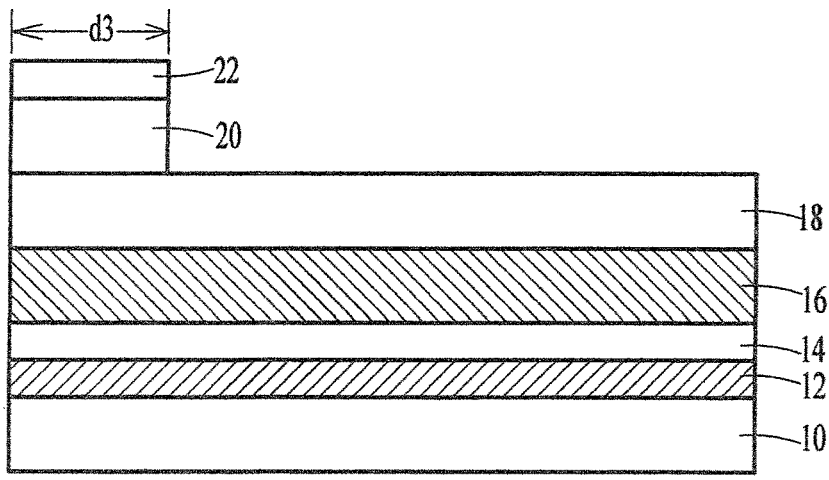

During the next step, pure $O_2$ or $O_2$ mixed with a halogen such as $Cl_2$ or HBr is used to isotropically etch the SOC hard mask 20, reducing the pattern size to d3 (~40 nm) as shown in FIG. 3. This $O_2$ based plasma has a very low etch rate on Si HM above and SiON underneath, again allowing for a high quality pattern. The photoresist mask 25 is removed during this etch step.

Figure 4:
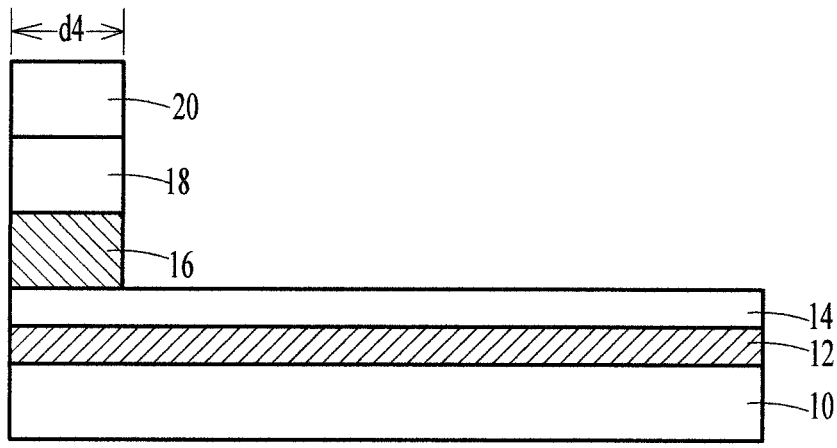
Figure 5:
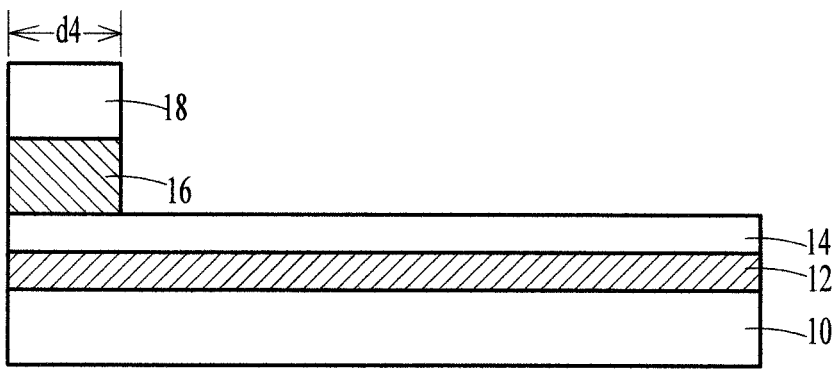

For the next step of SiON and metal hard mask etch, a fluorine based plasma is again used. This plasma readily etches SiON 18 and metal 16, but not SOC 20 above and MTJ 14 underneath. By utilizing a high source power and low bias power, an isotropic chemical etch is again used and reduces the pattern size to d4 (~30 nm) as shown in FIG. 4. A fluorine-based gas such as $CF_4$ or $CHF_3$ is mixed with $O_2$. A high source power of between about 300 and 1000 watts and a low bias power of between about 20 and 100 W is applied. Alternatively, prior to the last step of MTJ etch, any remaining SOC 20 on top is stripped away by $O_2$, $H_2O$ vapor or their mixture, keeping the pattern size the same, as shown in FIG. 5.

Figure 6:
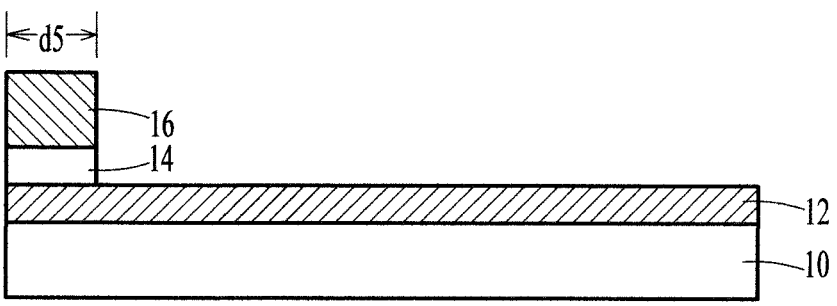

Lastly, a plasma species with high source power and low bias power, such as $CH_3OH$ or $CH_3OH$ mixed with Ar is used to isotropically etch the MTJ. A high source power of between about 1000 and 3000 W and a low bias power of between about 100 and 1000 W is applied. These gases and etch conditions are used because the magnetic materials within the MTJ stack can be readily etched away and reduce the pattern size to d5 (~20 nm), as shown in FIG. 6.

Figure 7:
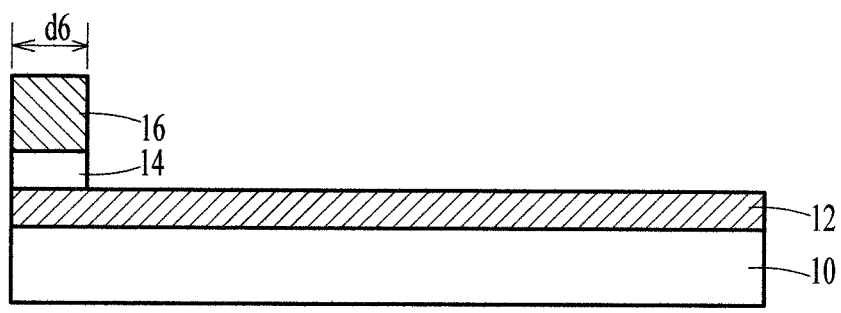
FIG. 7 illustrates in cross-sectional representation an optional additional step in a preferred embodiment of the present disclosure.

In an optional additional step, as shown in FIG. 7, after the $CH_3OH$ or $CH_3OH$/Ar RIE etch, ion beam etching (IBE) using Ar plasma with a RF power of between about 500 to 1000 W is applied to the MTJ sidewalls to remove any damage and metal re-deposition from the previous RIE step. This further decreases the MTJ size to d6 (~15 nm).

Figure 8:
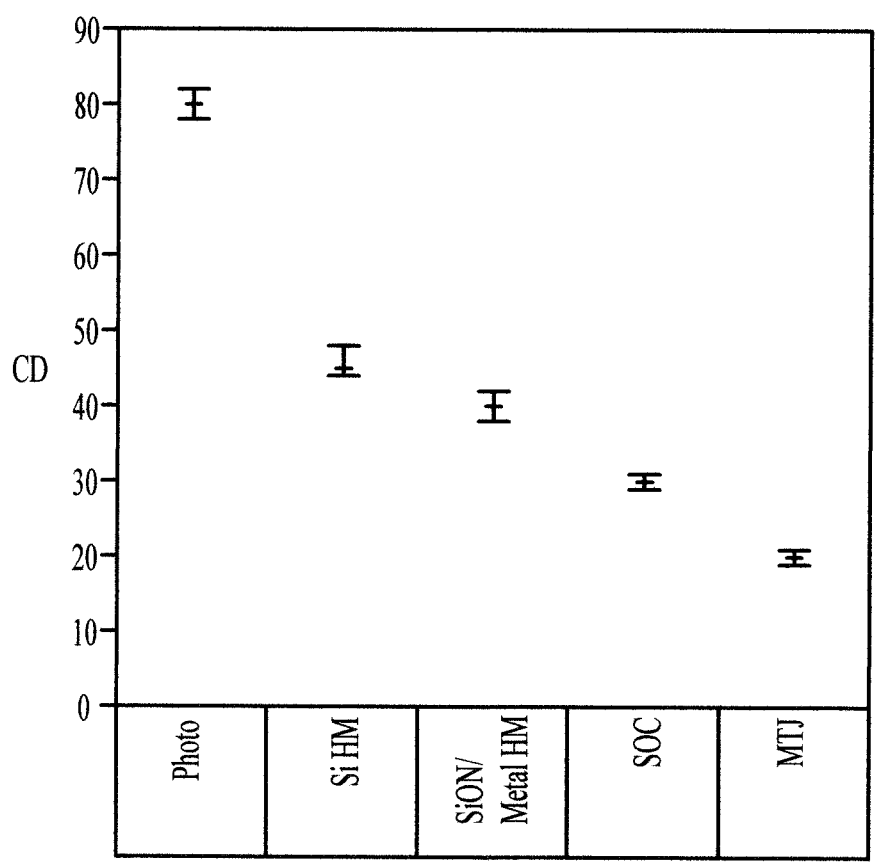
FIG. 8 is a graphical representation of the overall decrease in pattern size from initial photoresist to multiple hard masks and final MTJ device in a preferred embodiment of the present disclosure.

Scanning Electron Microscope (SEM) images confirm the decrease in pattern size over the process steps. FIG. 8 graphically illustrates the overall decrease in pattern size for the hard mask materials.

The process of the present disclosure creates sub 20 nm MTJ cell size by reducing the multiple hard masks' sizes during plasma etch. The multiple hard masks also allow for a better selectivity during etch, thus resulting in a higher device size and performance uniformity. Compared to the complex and expensive immersion 193 nm photolithography instruments with optical proximity correction (OPC) that people are using to deliver the same results, this is a much simpler and lower cost approach.

This process can be used especially for MRAM chips of the size smaller than 60 nm, which requires smaller critical dimension (CD) and higher device uniformity. Multiple hard masks are used to pattern the MTJ cells, by RIE alone or combined with IBE. The pattern size of each layer of hard mask is reduced by optimizing the plasma etch conditions to form an isotropic etch. The MTJ is isotropically etched by RIE, IBE or their combination, eventually reducing the pattern size to 20 nm and below. Due to the high selectivity, the integrity of patterns is preserved, leading to improved MTJ size uniformity.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method comprising:
   forming a magnetic tunneling junction (MTJ) stack on a substrate;
   forming a first hard mask layer on the MTJ stack;
   forming a second hard mask layer on the first hard mask layer;
   forming a third hard mask layer on the second hard mask layer, wherein at least one of the first, second and third hard mask layers is formed of a different material than the other hard mask layers;
   patterning the third hard mask layer such that the patterned third hard mask layer has a first pattern size;
   patterning the second hard mask layer by using the patterned third hard mask layer as a mask, the patterned second hard mask layer having a second pattern size that is different than the first pattern size;
   patterning the first hard mask layer by using the patterned second hard mask layer as a mask, the patterned first hard mask layer having a third pattern size that is different than the second pattern size;
   patterning the MTJ stack by using the patterned first hard mask layer as a mask, the patterned MTJ stack having a fourth pattern size that is different than the third pattern size; and
   applying an ion beam etching process to the patterned MTJ stack by using the patterned first hard mask layer as a mask, wherein the patterned MTJ stack has a fifth pattern size that is different than the fourth pattern size after the applying of the ion beam etching process to the patterned MTJ stack.

2. The method of claim 1, wherein at least one of the first, second and third hard mask layers is formed of a metal material.

3. The method of claim 1, wherein the first hard mask layer is a metal hard mask, and
   wherein the forming of the first hard mask layer on the MTJ stack include forming the metal had mask directly on the MTJ stack.

4. The method of claim 1, wherein the first pattern size is greater than the second pattern size,
   wherein the second pattern size is greater than the third pattern size, and
   wherein the third pattern size is greater than the fourth pattern size.

5. The method of claim 1, wherein the patterning of the third hard mask layer includes performing a first etching process with a first etchant,
   wherein the patterning of the second hard mask layer includes performing a second etching process with a second etchant that is different than the first etchant, and wherein the patterning of the first hard mask layer includes performing a third etching process with the first etchant.

6. The method of claim 5, wherein the first etchant includes a fluorine-based gas.

7. The method of claim 1, wherein the first hard mask layer has a first thickness,
wherein the second hard mask layer has a second thickness, and
wherein the third hard mask layer has a third thickness, wherein the first, second and third thicknesses are all different from each other.

8. The method of claim 1, wherein the first hard mask layer is formed of a metal material, and
wherein the second and third dielectric hard mask layers are formed of different materials.

9. A method comprising:
providing a MTJ stack on a substrate;
forming a first hard mask layer on the MTJ stack;
forming a second hard mask layer on the first hard mask layer;
forming a third hard mask layer on the second hard mask layer;
forming a fourth hard mask layer on the third hard mask layer, wherein the first, second, third and fourth hard mask layers are formed of different materials with respect to each other;
patterning the fourth hard mask layer such that the patterned fourth hard mask layer has a first pattern size;
patterning the third hard mask layer by using the patterned fourth hard mask layer as a mask, the patterned third hard mask layer having a second pattern size that is less than the first pattern size;
patterning the second hard mask layer and the first hard mask layer by using the patterned third hard mask layer as a mask, the patterned second hard mask layer and the patterned first hard mask layer each having a third pattern size that is less than the second pattern size;
patterning the MTJ stack by using the patterned first hard mask layer as a mask, the patterned MTJ stack having a fourth pattern size that is less than the third pattern size; and
applying an ion beam etching process to the patterned MTJ stack by using the patterned first hard mask layer as a mask, wherein the patterned MTJ stack has a fifth pattern size that is smaller than the fourth pattern size after the applying of the ion beam etching process to the patterned MTJ stack.

10. The method of claim 9, wherein the patterning of the MTJ stack by using the patterned first hard mask layer as the mask further includes using the patterned second hard mask layer as part of the mask.

11. The method of claim 9, wherein the patterning of the fourth hard mask layer includes etching with a plasma using a fluorine-based gas.

12. The method of claim 9, wherein the patterning of the third hard mask layer includes etching with a material selected from the group consisting of pure $O_2$, $O_2$ mixed with a halogen comprising $Cl_2$, and HBr.

13. The method of claim 9, wherein the patterning of the second hard mask layer and the first hard mask layer includes etching with a plasma using a fluorine-based gas.

14. The method of claim 9, wherein the first pattern size is between about 45 nm and about 50 nm,
wherein the second pattern size is between about 30 nm and about 40 nm,
wherein the third pattern size is between about 20 nm and about 30 nm, and
wherein the fourth pattern size is between about 15 nm and about 20 nm.

15. The method of claim 9, wherein the first hard mask layer includes a material selected from the group consisting of Ta, Ti, TaN, and TiN,
wherein the second hard mask layer includes a material selected from the group consisting of silicon oxynitride, silicon oxide, and silicon nitride,
wherein the third hard mask layer includes a material selected from the group consisting of spin-on carbon and amorphous carbon, and
wherein the fourth hard mask layer includes a material selected from the group consisting of silicon, silicon oxynitride, and silicon nitride.

16. A method comprising:
providing a MTJ stack on a substrate;
forming a metal hard mask layer on the MTJ stack;
forming a first dielectric hard mask layer on the metal hard mask layer;
forming a second dielectric hard mask layer on the first dielectric hard mask layer;
forming a third dielectric hard mask layer on the second dielectric hard mask layer, wherein at least one of the first, second, third dielectric hard mask layers is formed of different material than the other dielectric hard mask layers;
patterning the third dielectric hard mask layer such that the patterned third dielectric hard mask layer has a first pattern size;
patterning the second dielectric hard mask layer such that the patterned second dielectric hard mask layer has a second pattern size that is less than the first pattern size;
patterning the first dielectric hard mask layer and the metal hard mask layer such that the patterned first dielectric hard mask layer and the patterned metal hard mask layer each have a third pattern size that is less than the second pattern size; and
patterning the MTJ stack by using the patterned first dielectric hard mask layer and the patterned hard mask layer as a mask, the patterned MTJ stack having a fourth pattern size that is less than the third pattern size.

17. The method of claim 16, further comprising removing the patterned third dielectric hard mask layer prior to the patterning of the first dielectric hard mask layer and the metal hard mask layer.

18. The method of claim 16, further comprising removing the patterned second dielectric hard mask layer prior to the patterning of the MTJ stack.

19. The method of claim 16, further comprising removing metal re-deposition from the patterned MTJ stack, and
wherein the patterned MTJ has a fifth pattern size after the removing of the metal re-deposition from the patterned MTJ stack, the fifth pattern size being smaller than the fourth pattern size.

20. The method of claim 16, wherein the patterning of the third dielectric hard mask layer includes etching with a plasma using a fluorine-based gas comprising $CF_4$ or $CHF_3$ said fluorine-based gas being mixed with $O_2$,
wherein the patterning of the second dielectric hard mask layer includes etching with pure $O_2$ or $O_2$ mixed with a halogen comprising $Cl_2$ or HBr,
wherein the patterning of the first dielectric hard mask layer and the metal hard mask layer includes etching with a plasma using a fluorine-based gas comprising $CF_4$ or $CHF_3$ said fluorine-based gas being mixed with $O_2$ under a high source power and low bias power, and wherein the patterning of the MTJ stack includes etching with high source power and low bias power and with a plasma species includes $CH_3OH$ or $CH_3OH$.

* * * * *